(12) United States Patent
Shabbir et al.

(10) Patent No.: US 6,400,565 B1
(45) Date of Patent: Jun. 4, 2002

(54) THERMALLY CONDUCTIVE INTERFACE MEMBER

(75) Inventors: Hasnain Shabbir; Rakesh Bhatia, both of Austin, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 09/553,673

(22) Filed: Apr. 21, 2000

(51) Int. Cl.7 .............................. G06F 1/20; H05K 7/20
(52) U.S. Cl. ........................ 361/687; 361/700; 361/707; 165/104.33
(58) Field of Search .................................. 361/687, 700, 361/704, 705, 707, 708; 174/15.2, 16.3; 165/104.33

(56) References Cited

U.S. PATENT DOCUMENTS

| | | |
|---|---|---|
| 4,029,999 A | 6/1977 | Neumann et al. |
| 4,233,645 A | 11/1980 | Balderes et al. |
| 4,265,775 A | 5/1981 | Aakalu et al. |
| 4,708,812 A | 11/1987 | Hatfield |
| 5,060,114 A | 10/1991 | Feinberg et al. |
| 5,184,211 A | 2/1993 | Fox |
| 5,455,458 A | 10/1995 | Quon et al. |
| 5,591,034 A | 1/1997 | Ameen et al. |
| 5,738,936 A | 4/1998 | Hanrahan |
| 5,875,095 A * | 2/1999 | Webb ........................... 361/700 |
| 5,926,371 A * | 7/1999 | Dolbear ....................... 361/704 |
| 5,930,115 A * | 7/1999 | Tracy et al. ................. 361/704 |
| 5,945,217 A * | 8/1999 | Hanrahan .................... 428/389 |
| 6,004,662 A | 12/1999 | Buckley |
| 6,125,035 A * | 9/2000 | Hood, III et al. ........... 361/687 |
| 6,212,074 B1 * | 4/2001 | Gonsalves et al. .......... 361/717 |
| 6,226,184 B1 * | 5/2001 | Stolz et al. .................. 361/704 |

* cited by examiner

Primary Examiner—Lynn D. Feild
(74) Attorney, Agent, or Firm—Haynes and Boone, LLP

(57) ABSTRACT

An electronic package including a printed circuit substrate having a semiconductor device mounted thereon. A heat dissipating device is attached to the semiconductor device. A thermal interface member is mounted between the semiconductor device and the heat dissipating device. The thermal interface member includes a thermally conductive elastomeric pad and a layer of thermally conductive phase change material attached to a surface of the elastomeric pad. The elastomeric pad is engaged with a surface of the semiconductor device and the phase change material is engaged with a surface of the heat dissipating device. Heat transfer from the semiconductor device to the heat dissipating device is significantly increased. The heat dissipating device can be detached from the semiconductor device without destroying the thermal transfer member, allowing the thermal interface member to be reused with the heat dissipating device.

22 Claims, 3 Drawing Sheets

THERMALLY CONDUCTIVE INTERFACE MEMBER

BACKGROUND

The disclosures herein relate generally to thermally conductive interface members. More particularly, the disclosures herein relate to thermally conductive interface members for heat generating components in a computer system.

Heat dissipating devices are commonly used to aid in dissipating heat from heat generating components in electronic devices such as computers. The performance and operating life of heat generating components are adversely affected by excessive temperatures. Heat dissipating devices are configured to readily dissipate heat from one or more heat generating components to the surrounding atmosphere. To provide for acceptable and efficient heat transfer, the heat dissipating device must be in sufficient contact with the heat generating component.

In a portable computer, the use of a heat dissipating device to control the operating temperature of the microprocessor is essential. Furthermore, maintaining a suitable thermal interface between the microprocessor and the heat dissipating device is extremely critical. If the microprocessor temperature is not kept within the specification limits of the component, the effective life and performance of the microprocessor will be greatly diminished. Minimizing the thermal resistance between the microprocessor and the heat dissipating device greatly improves cooling efficiency.

U.S. Pat. No. 5,738,936 discloses a thermally conductive article including a polytetrafluoroethylene matrix, an elastomer interpenetrating the polytetrafluoroethylene matrix, thermally conductive particles and expanded polymeric particles. The thermally conductive article is compressible.

U.S. Pat. No. 5,060,114 discloses a conformable, gel-like pad with a thermally conductive additive that conducts heat away from a packaged electronic power device to with which it is in contact. The pad includes particles of a thermally conductive material such as aluminum, nickel, aluminum oxide, iron oxide, beryllium oxide, or silver. A thin, solid sheet of a thermally conductive metal such as aluminum, positioned in contact with a surface of the conformable pad, further increases heat removal.

U.S. Pat. No. 5,184,211 discloses a packaging and cooling assembly for semiconductor devices. The assembly includes a base for receiving one or more semiconductor devices and a combination heat sink and cover for attachment to the base. Compliant cushions that generally conform to the shape and size of the semiconductor devices are held loosely between the circuit sides of the semiconductor devices and the base. The heat sink engages the back sides of the semiconductor devices when it is attached to the base, causing the semiconductor devices to compress the compliant cushions and hold the semiconductor devices firmly in position. In this manner, a low resistance thermal interface is established between the semiconductor devices and the heat sink. To further enhance the heat transfer characteristics of the interface, a thin film of fluid is coated on the back sides of each semiconductor device to fill in the microvoids which result from uneven contact of the heat sink and semiconductor device mating surfaces.

U.S. Pat. No. 4,233,645 discloses a semiconductor device package having a substrate, one or more semiconductor devices mounted on a top surface of the substrate, and a heat sink having a surface in opposed spaced parallel relation to the top surface of the substrate. At least one deformable heat transfer member is positioned between a device mounted on the top surface of the substrate and the surface of the heat sink. The heat transfer member includes a porous block of material having a heat conductive non-volatile liquid retained within the block of material by a surface tension. The heat transfer member is operative to transfer heat from the device to the heat sink.

Direct contact of the heat dissipating device, such as a heat sink or a thermal block, with the microprocessor is undesirable in many applications. Recently, some manufacturers have begun designing their microprocessors without an integral heat plate for being engaged by the heat dissipating device. As a result, the microprocessor can be easily damaged by stresses caused by direct contact with an object such as a heat sink or thermal block.

To permit effective heat transfer between the heat dissipating device and the heat generating component, such as between a heat sink and a microprocessor, a suitable thermal interface material is needed to ensure maximum surface-to-surface contact. Thermal pads, phase change materials and thermal grease represent the three most common types of thermal interface materials. Thermal greases and phase change materials typically have a thermal resistance approximately one-tenth that of thermal pads.

The superior thermal resistance of thermal greases and phase change materials is partially due to their being "flowable" materials. By flowable, it is meant that, above a specified temperature, they flow to conform to surface imperfections of the heat dissipating device and heat generating component. Another benefit of flowable materials is that their effectiveness is not adversely impacted by nominal misalignment between the heat generating component and the heat dissipating device. A major disadvantage of phase change material is that the phase change material does not release cleanly from the corresponding mating surface of the heat dissipating device and/or heat generating component when the heat dissipating body is detached from the heat generating component. Consequently, a residue remains on the mating surfaces of the heat dissipating body and heat generating component. Prior to reassembly, any residue must be cleaned from the surfaces.

Currently, elastomer pads are the preferred type of thermal interface material for portable computers. An elastomer pad is positioned between the heat generating component, such as the microprocessor, and the heat dissipating body, such as a heat spreading block. It is common for one side of the pad to be coated with an acrylic adhesive so that the pad may be attached to the heat spreader block without falling off prior to final assembly.

Acrylic adhesives have low thermal conductivity, adding significantly to the thermal resistance of the elastomeric pad. The microscopic gaps associated with roughness of the contact surface of the heat dissipating device are filled by the adhesive. Due to the low thermal conductivity of the pad, the effective thermal resistance between the heat generating component and the heat dissipating device is increased.

Accordingly, what is needed is a thermal interface member that provides a low thermal resistance at the mating surfaces of a heat dissipating body and a heat generating component and that cost-effectively facilitates replacement of the heat generating component.

SUMMARY

One embodiment, accordingly, provides a thermal interface member including a first thermally conductive layer for being engaged with a surface of a heat dissipating device and a second thermally conductive layer for being engaged with a surface of a heat generating component. To this end, one embodiment provides a thermal interface member including a first thermally conductive layer and a second thermally conductive layer attached to a surface of the first thermally conductive layer. The first thermally conductive layer is resiliently compressible and the second thermally conductive layer is formed of a phase change material.

A principal advantage of this embodiment is that the heat transfer from a heat generating component to a heat dissipating device is significantly increased.

BRIEF DESCRIPTION OF THE DRAWING FIGURES

DETAILED DESCRIPTION

Figure 1:
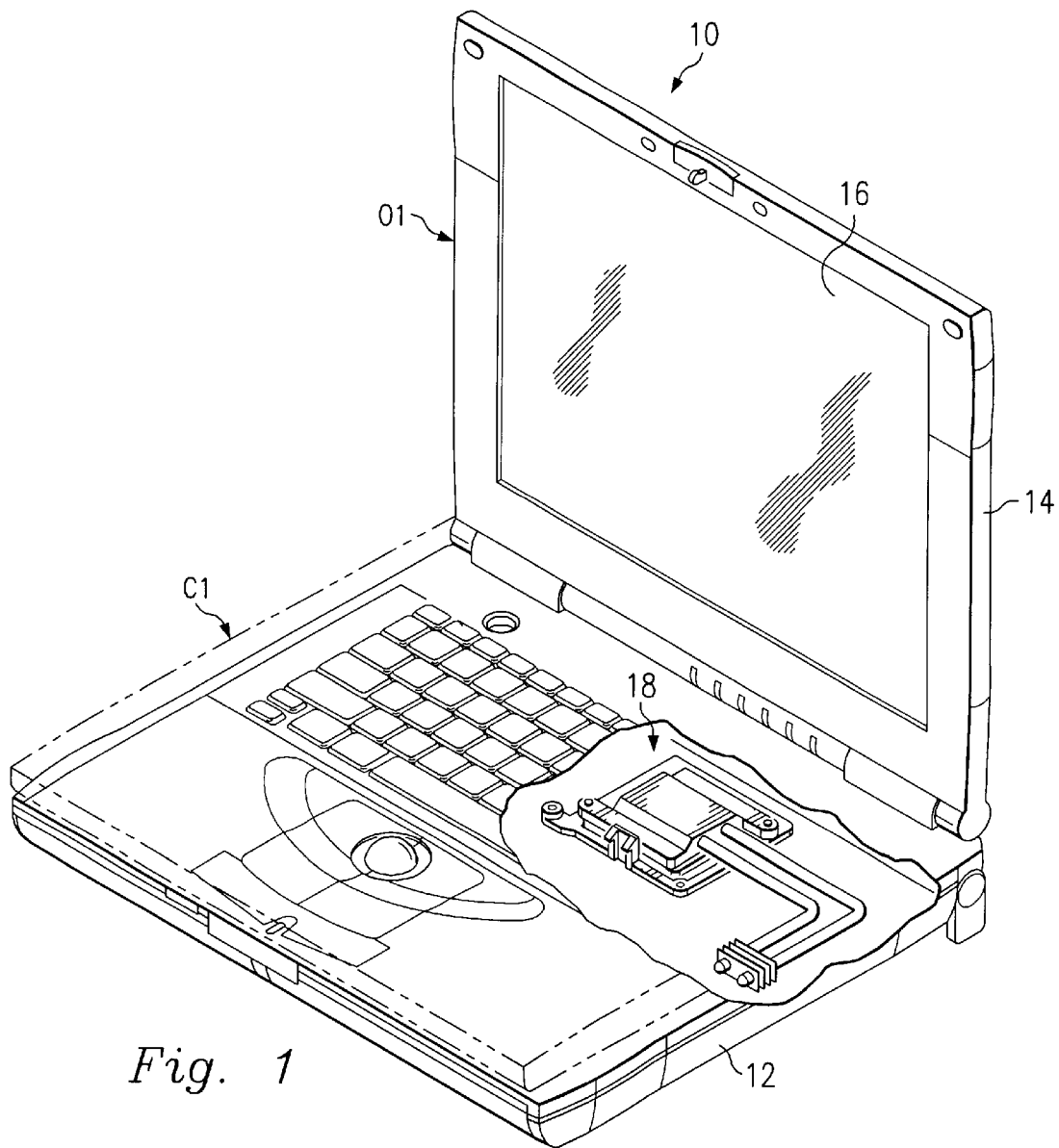
FIG. 1 is a perspective view illustrating an embodiment of a portable computer including a cut away portion of a keyboard.

An embodiment of a portable computer 10 is illustrated in FIG. 1. The portable computer 10 includes a base enclosure 12 and a top enclosure 14 pivotally attached to the base enclosure 12. The top enclosure 14 is movable between an open position O1 and a closed position C1. An LCD panel 16 is mounted in the top enclosure 14. An apparatus 18 for mounting and cooling a system component such as a microprocessor, video controller, or the like is mounted in the base enclosure 12 beneath a keyboard 19, a portion of which has been cut away.

Figure 2:
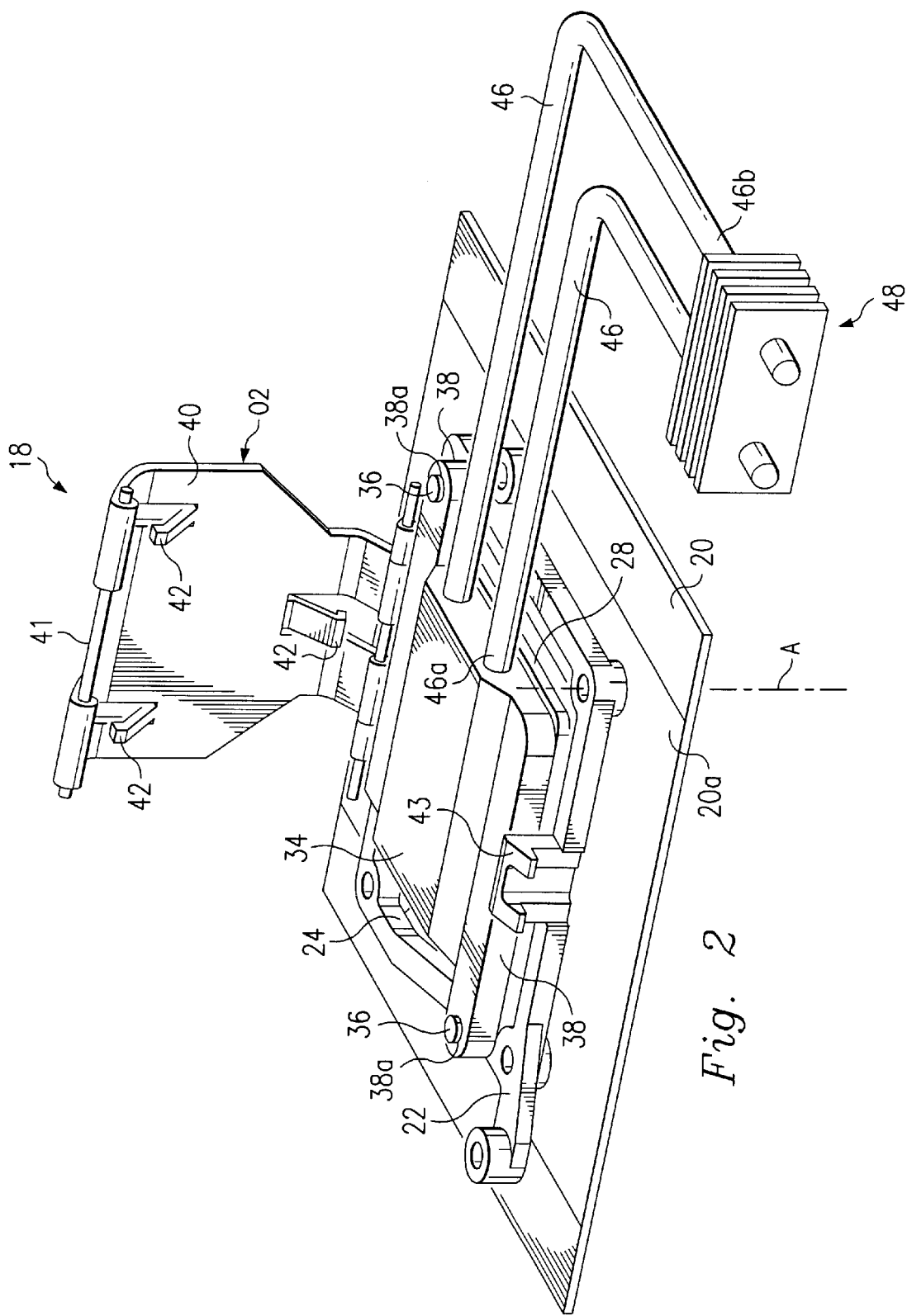
FIG. 2 is a perspective view illustrating an embodiment of an apparatus for mounting a heat generating component and a heat dissipating device on a base member.
Figure 3:
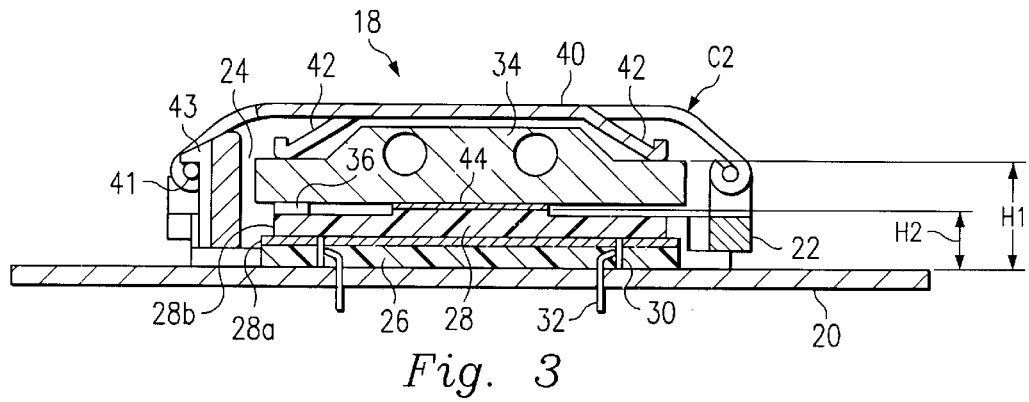
FIG. 3 is a cross sectional view of the mounting apparatus of FIG. 2 with a retaining member in a closed position.

Referring now to FIGS. 2 and 3, the apparatus 18 includes a base member 20 such as a motherboard or other type of printed circuit substrate. The base member 20 includes a reference voltage plane 20a. A mounting frame 22 including a passage 24 extending therethrough is mounted on the base member 20. In a preferred configuration, the mounting frame 22 is made of an electrically conductive material and is electrically connected to the reference voltage plane 20a. The mounting frame 22 may be attached to the base member 20 by mechanical fasteners such as screws or rivets, or it may be attached to the base member 20 through the use of an adhesive such as a conductive adhesive.

A socket 26, FIG. 3, is mounted on the base member 20 within a passage 24 of the mounting frame 22. A heat generating component 28, such as a system component of the portable computer 10, is mounted on and electrically connected to the socket 26. The heat generating component 28 includes a plurality of first interconnect members 30, such as interconnect pins, that are engaged by corresponding second interconnect members 32 of the socket 26. In the embodiment illustrated in FIG. 3, the heat generating component 28 includes an interposer circuit 28a and a semiconductor device 28b such as an unpackaged semiconductor chip mounted on the interposer circuit 28a.

A heat extraction body 34, FIGS. 2 and 3, is engaged with a surface of the heat generating component 28. The mounting frame 22 includes a plurality of alignment members 36, such as pins, attached thereto. The heat extraction body 34 includes a plurality of reference members 38 having alignment holes 38a extending therethrough. Each alignment member 36 engages the alignment hole 38a of the corresponding reference member 38 to positively position the heat extraction body 34 with respect to the passage 24. By positively positioning the heat extraction body 34 with respect to the passage 24, the heat extraction body 34 is positively positioned with respect to the heat generating component 28. Furthermore, the configuration of the alignment members 36 and reference members 38 limits movement of the heat extraction body 34 in directions perpendicular to a reference axis A, FIG. 2, extending generally perpendicular to a surface of the base member 20. The heat extraction body 34 may move in a direction generally parallel to the reference axis A, permitting for height compensation for mechanical tolerances associated with the socket 26 and the heat generating component 28.

A retaining member 40, such as a hinged cover, is movably attached to the mounting frame 22 for being moved between an open position O2, FIG. 2, and a closed position C2, FIG. 3. A retention member 41 is attached to the retaining member 40 and a mating retention member 43 is attached to the mounting frame 22. The retention member 41 engages the mating retention member 43 when the retaining member 40 is moved to the closed position C2 for releasably securing the retaining member 40 in the closed position C2.

A plurality of resilient members 42, such as spring fingers, are integrally attached to the retaining member 40. In other embodiments (not shown), the resilient members 42 may be compression springs, leaf-type springs, compliant pads or the like that are disposed between the heat extraction body 34 and the retaining member 40, but are not integral with the retaining member 40. The resilient members 42 compressibly engage the heat extraction body 34 when the retaining member is moved to the closed position C2, urging the heat extraction body 34 into contact with the heat generating component 28. A thermal interface member 44, such as a thermal pad or a phase change material, is disposed between the heat extraction body 34 and the heat generating component 28 for enhancing heat transfer.

As illustrated in FIG. 2, a plurality of heat routing members 46, such as heat pipes, are attached at a first end 46a to the heat extraction body 34. Each one of the heat routing members 46 are attached at a second end 46b to a heat dissipating body 48. Heat pipes illustrate one example of the heat routing members 46. The first end 46a corresponds to an evaporator portion of the heat pipe and the second end 46b of the heat routing member 46 corresponds to a condenser portion of the heat pipe. Cooling fins and a heat exchanger illustrate examples of the heat dissipating body 48. The combined use of the heat extraction body 34, the heat routing member 46 and the heat dissipating body 48 illustrate an example of a heat dissipating device.

A key advantage of the embodiments disclosed herein is that the apparatus 18 compensates for tolerance stack-up associated with the socket 26, the heat generating component 28, and the heat extraction body 34. The socket 26, the heat generating component 28, and the heat extraction body 34 each have dimensional tolerance values that contribute to defining an overall height H1, FIG. 3. The overall height H1 is the vertical distance from the base member 20 to the surface of the heat extraction body 34 that is engaged by the resilient members 42. For commercially available components, this height is typically between 5.4 and 6.0 mm. The dimensional tolerance values of the socket 26 and the heat generating component 28 also contribute to defining a thermal interface height H2, FIG. 3. The thermal interface height H2 is the vertical distance from the base member 20 to the surface of the heat generating component 28 that is engaged by the heat extraction body 34.

The construction of the apparatus 18 allows the heat extraction body 34 to float with respect to the mounting frame 22, minimizing a thermal gap defined between the heat extraction body 34 and the heat generating component 28. The configuration of the resilient members 42 and the retaining member 40 results in the deflection of the resilient members 42 being based on the overall height H1. Even through the overall height H1 and the thermal interface height H2 vary, the resiliency of the resilient members 42 and the floating nature of the heat extraction body 34 compensate for tolerance-induced height variations.

Another key advantage of the embodiments disclosed herein is that the compensation for tolerance-induced height variations is accomplished automatically. The act of moving the retaining member 40 to the closed position C2, and engaging the retention member 41 with the mating retention member 43, engages the resilient members 42 with heat extraction body 34. Accordingly, the resilient members 42 are deflected, providing an applied force for urging the heat extraction body 34 into contact with the heat generating component 28. The resilient members 42 are constructed to provide a required applied force on the heat extraction member, even though the overall height H1 and the thermal interface height H2 vary according to the tolerance stack-up. An applied force of 40 to 100 psi is common for commercially available microprocessors.

It is yet a further advantage of the embodiments disclosed herein that the mounting frame 22, the socket 26, the heat generating component 28 and the heat extraction body 34 may be electrically coupled to the reference voltage plane 20a. This type of construction provides a low impedance return current path between the various components of the apparatus 18, reducing noise in the circuitry. This is beneficial in applications where the heat generating component 28 operates at relatively high speeds.

Figure 4:
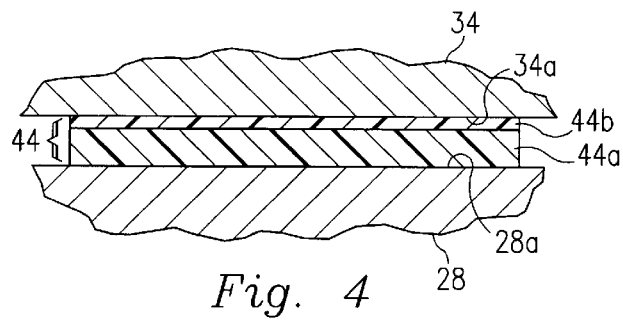
FIG. 4 is a cross sectional view illustrating an embodiment of a thermal interface member mounted between a heat dissipating device and a heat generating component.

As illustrated in FIG. 4, the thermal interface member 44 includes a first thermally conductive layer 44a and a second thermally conductive layer 44b. The first thermally conductive layer 44a is attached to the second thermally conductive layer 44b. The first thermally conductive layer 44a is engaged with a contact surface 28a of the heat generating component 28 and the second thermally conductive layer 44b is engaged with a contact surface 34a of the heat dissipating body 34.

A preferred material for the first thermally conductive layer 44a is a thermally conductive material that is resiliently compressible. An example of such a material is offered by Thermagon Incorporated under the tradename T-pli 200 Series. This material is a non-tacky, thermally conductive elastomeric material that provides compressibility and suitable heat transfer properties. Typical properties for the T-pli 200 Series material include thermal conductivity of greater than about 10 Watts/m° C. and a hardness of less than about 10 Shore A for thicknesses greater than about 5 mils. The thickness of the first thermally conductive layer will typically be between from about 5 mils to about 200 mils, and preferably between about 5 mils and 20 mils.

A resiliently compressible material is preferred for the first thermally conductive layer for several reasons. Misalignment between the heat generating component and the heat dissipating body are compensated for by the resiliently compressible material. Similarly, tolerance stack-up between the heat dissipating body and heat generating component is compensated for by the resiliently compressible material. By compensating for misalignment and tolerance stack-up, stress concentrations and the resulting potential damage to the heat generating component is greatly reduced. Furthermore, the effective area of the thermal interface between the heat generating component and the heat dissipating body is increased, thereby increasing heat transfer therebetween.

The non-tacky nature of the first thermally conductive layer permits the thermal interface member to be released from the contact surface of the heat generating component without leaving any substantial amount of residue. This is beneficial during rework or replacement of the heat generating component, precluding the contact surface of the heat generating component from having to be cleaned.

A preferred material for the second thermally conductive layer 44b is phase change material. Phase change materials are defined herein to mean materials that change from a first physical state, such as substantially solid, to a second physical state, such as substantially fluid, at a specified phase change temperature. Most phase change materials will be partially tacky, particularly at elevated temperatures.

Suitable phase change materials are offered by Thermagon Incorporated under the tradename T-pcm Series 700 and T-pcm Series 900. Typical properties for the T-pcm Series 700 and T-pcm Series 900 materials include thermal conductivity of greater than about 1 Watts/m° C. and a phase change temperature of less than about 50° C. The thickness of the second thermally conductive layer will typically be between from about 5 mils to about 20 mils, and preferably between from about 5 mils to about 10 mils.

A phase change material is desirable for the second thermally conductive layer for several reasons. Typically, the surface of the heat dissipating body that is engaged by the thermal interface member includes surface irregularities. To enhance heat transfer, it is necessary for the thermal interface member to be in intimate contact with the mating surface of the heat dissipating body. Through the use of the phase change material as the second thermally conductive layer of the thermal interface member, intimate contact is provided with the contact surface of the heat dissipating body, even in view of the irregularities in the contact surface.

Most phase change materials are a layer of wax-like material that melts at a relatively low temperature. Upon changing from a generally solid state to a generally liquid state, the phase change material flows into any microvoids formed by the irregularities in the contact surface, substantially 'wetting out' the contact surface of the heat dissipating body. Phase change materials are formulated to have a thixotropic composition such that they flow on a microscopic level and not on a macroscopic level. Therefore, the thixotropic composition of phase change materials precludes them from completely flowing out of the space between the heat dissipating body and the heat generating component.

It is preferable to manufacture the thermal interface member 44 using a machine-based, reel-to-reel or batch process, rather than a hand assembly process. Variations in a hand assembly process can result in variations and deflects that will adversely affect thermal conductivity. In a preferred process, the first thermally conductive layer 44a is formed on a release liner. The second thermally conductive layer is then formed on a surface of the first thermally conductive layer, forming a sheet of thermal interface material. The sheet of thermal interface material may be cut into discrete pieces, cut into panels or formed into rolls.

The first and the second thermally conductive layers may be formed using commercially available equipment such as roll-to-roll coaters, extruders, and/or laminating equipment. It is desirable to form the second thermally conductive layer on the first thermally conductive layer in a manner where the second thermally conductive layer is formed at an elevated temperature. In doing so, a physical bond and in some cases, a molecular bond is formed between the two layers such that the thermal resistance therebetween is reduced.

Figure 5:
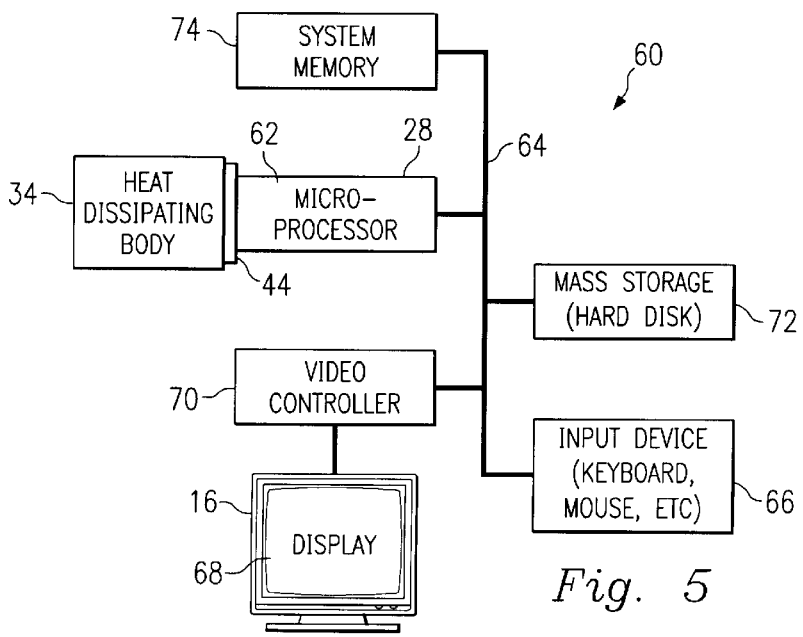
FIG. 5 is a block diagram view illustrating an embodiment of a computer system including a microprocessor having a heat dissipating body attached thereto.

An embodiment of a computer system 60 is illustrated in FIG. 5. The computer system 60 includes a microprocessor 62. The microprocessor 62 represents one example of the heat generating component 28 discussed above. The microprocessor 62 is connected to a bus 64 which serves as a connection between the microprocessor 62 and other components of the computer system 60. An input device 66 is coupled to the microprocessor 62 to provide input to the microprocessor 62. Examples of input devices include keyboards, touchscreens, and pointing devices such as a mouse, a trackball and a trackpad. The computer system 60 may also include a display 68, such as the LCD panel 16, FIG. 1, which is coupled to the microprocessor 62 typically by a video controller 70. Programs and data are stored on a mass storage device 72 which is coupled to the microprocessor 62. Mass storage devices include components such as hard disks, optical disks, magneto-optical drives, floppy drives, and the like. A system memory 74 provides the microprocessor 62 with fast storage to facilitate execution of computer programs by the microprocessor 62. As discussed above in reference to FIGS. 3 and 4, the heat dissipating body 34 is attached to the microprocessor 62 with the thermal interface member 44 mounted therebetween. It should be understood that other busses and intermediate circuits can be employed between the components described above and microprocessor 62 to facilitate interconnection between the components and the microprocessor 62.

As a result, one embodiment provides a thermal interface member including a first thermally conductive layer and a second thermally conductive layer attached to a surface of the first thermally conductive layer. The first thermally conductive layer is resiliently compressible and the second thermally conductive layer is formed of a phase change material.

Another embodiment provides a computer system including a microprocessor and a system memory coupled to the microprocessor for providing storage to facilitate execution of computer programs by the microprocessor. An input is coupled to provide input to the microprocessor. A display is coupled to the microprocessor by a video controller and a mass storage is coupled to the microprocessor. A heat dissipating device is attached to the microprocessor. A thermal interface member is mounted between the microprocessor and the heat dissipating device. The thermal interface member includes a first thermally conductive layer releasably engaged with a surface of the microprocessor and a second thermally conductive layer attached to a surface of the first thermally conductive layer and adhered to a surface of the heat dissipating device. The first thermally conductive layer is made of a resiliently compressible material and the second thermally conductive layer is made of a phase change material.

A further embodiment provides an electronic package including a printed circuit substrate having a semiconductor device mounted thereon. A heat dissipating device is attached to the semiconductor device. A thermal interface member is mounted between the semiconductor device and the heat dissipating device. The thermal interface member includes a thermally conductive elastomeric pad and a layer of thermally conductive phase change material attached to a surface of the elastomeric pad. The elastomeric pad is engaged with a surface of the semiconductor device and the phase change material is engaged with a surface of the heat dissipating device.

As it can be seen, the embodiments disclosed herein provide several advantages. Heat transfer from a heat generating component to a heat dissipating device is significantly increased. The heat dissipating device can be detached from the heat generating component without destroying the thermal transfer member, allowing the thermal interface member to be reused with the heat dissipating device. Lot-to-lot variability in the manufacture of thermal interface members is reduced. The elastomeric portion of the thermal interface member compensates for misalignment between the heat generating component and the heat dissipating body, increasing the area of the contact surface. The elastomeric portion of the thermal interface member reduces stress concentrations applied to the heat generating component. The elastomeric portion of the thermal interface member compensates for dimensional tolerance stack-up.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus for cooling comprising:
   a frame mounted adjacent a heat generating component;
   a retaining member movably attached to the frame;
   a securing member securing the retaining member in a closed position on the frame:
   a heat dissipating device thermally engaged with the heat generating component;
   a resilient member extending from the retaining member and engaged with the heat dissipating device when the retaining member is in the closed position;
   a first thermally conductive layer engaged with the heat generating component, the first thermally conductive layer being resiliently compressible; and
   a second thermally conductive layer attached to a surface of the first thermally conductive layer and engaged with the heat dissipating member, the second thermally conductive layer being a phase change material.

2. The thermal interface member of claim 1 wherein the first thermally conductive layer is formed of an elastomeric material.

3. The thermal interface member of claim 2 wherein the first thermally conductive layer has a thickness of from about 5 mils to about 20 mils and a hardness of less than about 10 Shore A and wherein the elastomeric material has a conductivity of greater than about 10 Watts/m ° C.

4. The thermal interface member of claim 1 wherein the first thermally conductive layer has a thickness of from about 5 mils to about 20 mils.

5. The thermal interface member of claim 1 wherein the first thermally conductive layer is formed of a material having a conductivity of less than about 10 Watts/m ° C.

6. The thermal interface member of claim 1 wherein the first thermally conductive layer has a hardness of less than about 10 Shore A.

7. The thermal interface member of claim 1 wherein the second thermally conductive layer has a thickness of from about 5 mils to about 20 mils and wherein the phase change material has a thermal conductivity of greater than about 1 W/m ° C. and a phase change temperature of less than about 50° C.

8. The thermal interface member of claim 1 wherein the second thermally conductive layer has a thickness of from about 5 mils to about 20 mils.

9. The thermal interface member of claim 1 wherein the phase change material has a thermal conductivity of greater than about 1 W/m ° C.

10. The thermal interface member of claim 1 wherein the phase change material has a phase change temperature of less than about 50° C.

11. A computer system, comprising:
   a microprocessor;
   a system memory coupled to provide storage to facilitate execution of computer programs by the microprocessor;
   an input coupled to provide input to the microprocessor;
   a video controller coupled to the microprocessor;
   a mass storage coupled to the microprocessor;
   a heat dissipating device thermally engaged with the microprocessor;
   a frame mounted adjacent the microprocessor;
   a retaining member movably attached to the frame;
   a securing member securing the retaining member in a closed position on the frame;
   a resilient member extending from the retaining member and engaged with the heat dissipating device when the retaining member is in the closed position; and
   a thermal interface member compressed between the microprocessor and the heat dissipating device when the retaining member is in the closed position, the thermal interface member including a first thermally conductive layer engaged with a surface of the microprocessor and a second thermally conductive layer attached to a surface of the first thermally conductive layer and engaged with a surface of the heat dissipating device, the first thermally conductive layer being formed of a resiliently compressible material and the second thermally conductive layer being formed of a phase change material.

12. The computer system of claim 11 wherein the first thermally conductive layer is releasably engaged with the surface of the microprocessor and the second thermally conductive layer is adhered to the surface of the heat dissipating device.

13. The computer system of claim 11 wherein the first thermally conductive layer is formed of an elastomeric material.

14. The computer system of claim 11 wherein the first thermally conductive layer has a thickness of from about 5 mils to about 20 mils.

15. The computer system of claim 11 wherein the first thermally conductive layer is formed from a material having a conductivity of greater than about 10 Watts/m ° C.

16. The computer system of claim 11 wherein the first thermally conductive layer has a hardness of less than about 10 Shore A.

17. The computer system of claim 11 wherein the second thermally conductive layer has a thickness of from about 5 mils to about 20 mils.

18. The computer system of claim 11 wherein the phase change material has a thermal conductivity of greater than about 1 W/m ° C.

19. The computer system of claim 11 wherein the phase change material has a phase change temperature of less than about 50° C.

20. The computer system of claim 11 wherein the heat dissipating device includes a heat sink, the second thermally conductive layer being engaged with a surface of the heat sink.

21. The computer system of claim 11 wherein the heat dissipating device includes a thermal transfer plate, the second thermally conductive layer being engaged with a surface of the thermal transfer plate.

22. An electronic package, comprising:
   a printed circuit substrate;
   a semiconductor device mounted on the printed circuit substrate;
   a heat dissipating device urged toward the semiconductor device by the resilient member;
   a frame mounted adjacent the semiconductor device;
   a retaining member movably attached to the frame;
   a securing member securing the retaining member in a closed position on the frame;
   a resilient member extending from the retaining member and engaged with the heat dissipating device when the retaining member is in the closed position; and
   a thermal interface member compressed between the semiconductor device and the heat dissipating device by the resilient member, the thermal interface member including a thermally conductive elastomeric pad and a layer of thermally conductive phase change material attached to a surface of the elastomeric pad, the elastomeric pad engaged with a surface of the semiconductor device and the phase change material engaged with a surface of the heat dissipating device.

\* \* \* \* \*

UNITED STATES PATENT AND TRADEMARK OFFICE
CERTIFICATE OF CORRECTION

PATENT NO. : 6,400,565 B1
DATED : June 4, 2002
INVENTOR(S) : Shabbir et al.

It is certified that error appears in the above-identified patent and that said Letters Patent is hereby corrected as shown below:

Column 8,
Lines 49, 52, 57, 60, 63 and 66, after "The", delete "thermal interface member" and insert -- apparatus --.

Column 9,
Lines 5, 8 and 11, after "The", delete "thermal interface member" and insert -- apparatus --.

Signed and Sealed this

Twenty-second Day of October, 2002

Attest:

JAMES E. ROGAN
Attesting Officer      Director of the United States Patent and Trademark Office